(12) United States Patent
Morgan et al.

(10) Patent No.: US 6,993,104 B2
(45) Date of Patent: Jan. 31, 2006

(54) APPARATUS AND METHOD FOR ADAPTIVELY ADJUSTING A TIMING LOOP

(75) Inventors: Jason N. Morgan, Madison, AL (US); Stacy M. Murphree, Madison, AL (US)

(73) Assignee: ADTRAN, Inc., Huntsville, AL (US)

( * ) Notice: Subject to any disclaimer, the term of this patent is extended or adjusted under 35 U.S.C. 154(b) by 817 days.

(21) Appl. No.: 09/844,242

(22) Filed: Apr. 27, 2001

(65) Prior Publication Data

US 2002/0186802 A1 Dec. 12, 2002

(51) Int. Cl.
*H04L 7/00* (2006.01)

(52) U.S. Cl. .................. 375/355; 375/326; 375/376; 375/372; 375/344; 327/156

(58) Field of Classification Search ................ 375/355, 375/344, 372, 376, 324, 354, 326; 348/229; 327/156
See application file for complete search history.

(56) References Cited

U.S. PATENT DOCUMENTS

| | | | | |
|---|---|---|---|---|
| 5,793,824 A | * | 8/1998 | Burch et al. | 375/372 |
| 5,943,369 A | * | 8/1999 | Knutson et al. | 375/326 |
| 6,018,556 A | * | 1/2000 | Janesch et al. | 375/376 |
| 6,081,563 A | * | 6/2000 | Taga et al. | 375/344 |
| 6,337,589 B1 | * | 1/2002 | Ooishi | 327/156 |
| 6,525,578 B2 | * | 2/2003 | Ooishi | 327/156 |
| 6,850,577 B2 | * | 2/2005 | Li | 375/326 |
| 2004/0047875 A1 | * | 3/2004 | Itani et al. | |

* cited by examiner

Primary Examiner—Shuwang Liu
Assistant Examiner—Eva Zheng
(74) Attorney, Agent, or Firm—Thomas, Kayden, Horstemeyer & Risley, L.L.P.

(57) ABSTRACT

A method and apparatus for adaptively adjusting the parameters of a timing loop based upon frequency errors between a data signal and a receiver's clock that is being used to sample the data signal are provided by the present invention. In accordance with the invention, the timing loop parameters are first set to an initial set of parameter values. A current frequency error between the data signal and the receiver's clock is calculated. The approximate average value of the frequency error is then determined. After a predetermined amount of time, the absolute value of the difference between the average frequency error and the current frequency error is examined. If the absolute value of the difference is less than a specified threshold, the timing loop parameters are reset to a second set of parameter values contained in a memory. The timing loop parameters are then reset to a third set of parameter values after a second interval of time. By adaptively adjusting the parameters of the timing loop based upon frequency errors, the present invention decreases the amount of time required for a receiver to train its timing loop to, and acquire timing from, a received data signal without introducing jitter into the signal.

22 Claims, 7 Drawing Sheets

APPARATUS AND METHOD FOR ADAPTIVELY ADJUSTING A TIMING LOOP

FIELD OF THE INVENTION

The present invention relates in general to digital data communication systems and, more particularly, to a new and improved apparatus and method for adaptively improving timing loop performance based upon the frequency error.

BACKGROUND OF THE INVENTION

In digital communications, it is necessary to synchronize or time align a local receiver's clock to a transmitter's clock when the transmitter transmits a data signal to the receiver. A phase locked loop in the receiver performs this synchronization function by locking a voltage controlled oscillator to the transmitter's clock. The voltage controlled oscillator provides a clock signal for sampling the received data signal.

For example, a Digital Data Service (DDS) transmitter at a central office is used to transmit a digital data signal to a remote location over a twisted pair of wires. The DDS transmitter at the central office typically utilizes a transmit clock that is derived from a relatively accurate network source. However, the clock in the receiver is typically generated by a voltage controlled oscillator that has a frequency that may vary slightly from the frequency of the network source. These variations in the receiver's clock frequency may occur for a number of reasons. For instance, manufacturing tolerances for voltage controlled oscillators typically result in individual oscillators that produce frequencies having some variance about a mean value. To correct for these frequency errors in the receiver, the DDS receiver must adapt its sampling frequency to match that of the DDS transmitter. Thus, the DDS receiver utilizes a timing loop having timing loop parameters to synchronize the receiver's clock with the transmitter's clock.

The values of the timing loop parameters determine the increments that the receiver will use to alter or adjust its clock frequency to match the frequency of the transmitter's clock. Typically, large timing loop parameter values cause the timing loop to alter the receiver's clock frequency to approach the transmit clock frequency more quickly. However, these larger values of the timing loop parameters also introduce additional jitter into the receiver when the frequency error between the transmit clock and the receiver's clock is relatively small. The increased jitter is a result of the relatively rapid changes in the receiver's clock frequency about a mean value that result from the relatively large timing loop parameter values. Smaller timing loop parameter values do not introduce as much jitter. Unfortunately, smaller timing loop parameter values also increase the time required for the timing loop to initially acquire synchronization when a large frequency error exists between the transmitter's clock and the receiver's sample clock. It is typical to maintain the larger timing loop parameters for a predetermined time that is long enough to acquire the timing when the initial frequency error is the maximum frequency error expected. The larger timing loop parameters could be maintained for a shorter amount of time when the initial frequency error is less than the maximum frequency error expected. However, when the data transmission from the DDS transmitter to the DDS receiver first begins, the difference between the frequency of the transmitter's clock and the receiver's clock is unknown. Thus, it is difficult to optimize the timing loop's performance for the majority of the cases where the initial frequency error is less than the maximum frequency error expected.

Since the time to acquire timing by a receiver is an accepted measure of performance, it is desirable to acquire timing as fast as possible. Therefore, what is needed is an apparatus or method that rapidly synchronizes or trains a receiver's clock to a transmitter's clock over a broad range of frequency errors.

SUMMARY OF THE INVENTION

A preferred embodiment of the present invention is directed toward a method of adapting a timing loop having timing loop parameters to an environment having a broad range of frequency errors. In accordance with the method, the timing loop parameters of the timing loop are set to initial values. A frequency error, $f_e$, between the receiver's clock frequency and the transmitter's clock frequency is measured. An average value of this frequency error, $f_{e,ave}$, is also determined. The average value of the frequency error is subtracted from the current frequency error to produce a difference value $\Delta f$ such that $\Delta f = f_e - f_{e,ave}$. After a predetermined interval of time, the difference value is examined. If the amplitude of the difference value is less than a threshold value, the timing loop parameters are reset to new values that are retrieved from a memory. Furthermore, in the preferred embodiment, the timing loop parameters are again reset to a second set of values after a second predetermined interval of time has passed since the amplitude of the difference value fell below the threshold value. The duration of the second interval of time is determined by the value of the frequency error. In an alternative embodiment, the threshold value is replaced with a second threshold value and the timing loop parameters are again reset to new parameter values if a second amplitude of the difference value is less than the second threshold.

The current frequency error and the average frequency error are preferably calculated as described below. The process begins by receiving a phase error from a phase detector and scaling this phase error by a gain factor of β. The scaled phase error is accumulated to produce the current frequency error. This current frequency error is then accumulated over an interval of time to produce an average frequency error. The difference between the current frequency error and the average frequency error is then determined and compared to the predetermined threshold as discussed above.

Adaptively adjusting the timing loop parameters based upon the difference between the frequency error and the average value of the frequency error allows the timing loop to acquire timing faster when the initial frequency error is less than the maximum frequency error expected. For most applications, the new adjusted values of the timing loop parameters will be less than the initial values of the timing loop parameters. Initially, large values of the parameters allow the timing loop to quickly modify the receiver's clock frequency to approach the transmitter's clock frequency. Once the frequency of the receiver's clock is relatively close to the frequency of the transmitter's clock, smaller values of the timing loop parameters are implemented to keep the receiver's clock frequency close to the transmitter's clock frequency and thereby minimize the introduction of additional jitter. Thus, the present invention is a substantial improvement upon the prior art.

The present invention also comprehends an apparatus for adaptively adjusting the timing of a receiver's clock to a transmitter's clock. The apparatus has a timing loop with timing loop parameters α and β. The timing loop trains the receiver's clock to the timing of the received digital data. A frequency error detector in the apparatus determines a current frequency error value between the received data signal and the local sample clock. A processor then determines an average value of the frequency error between the receiver's clock and the transmitter's clock over a period of time. The processor also calculates the absolute value of the difference between the current frequency error value and the average value of the frequency error over a period of time. If the absolute value of the difference is less than a threshold value, the processor controllably adjusts the timing loop parameters α and β, to new parameter values. The processor then further modifies the timing loop parameters α and β to new parameter values after each of a number of predetermined intervals of time. The durations of these intervals of time are chosen based on the value of the frequency error. The new timing loop parameter values and the durations of the time intervals are preferably retrieved from a memory located in the apparatus.

In a most preferred embodiment of the above discussed apparatus, the timing loop and the frequency error detector include a first scaled path having a first gain stage. The first gain stage produces an output equal to the phase error between the transmitter's clock and the receiver's clock scaled by a gain of α. A second scaled path having a second gain stage produces an output equal to the phase error scaled by a gain of β. An accumulator coupled to the output of the second scaled path produces an output equal to an accumulated value of the output of the second gain stage. This output is representative of the frequency error. A summing stage sums the output of the accumulator and the first gain stage. A phase accumulator then accumulates the output of the summing stage to produce an output signal that is used to adjust the timing of the local sample clock.

In an alternative embodiment, a steady state error removal unit receives the frequency error and produces an output equal to the absolute value of the difference between the frequency error and an average frequency error. The steady state error removal unit includes a scaled path that receives the frequency error and scales the frequency error by a scaling factor. An accumulator then accumulates the scaled frequency error over a period of time. Finally, a subtractor removes the accumulated scaled frequency errors from the current frequency error. A gain adjuster then adjusts the gain factors, or timing loop parameters, of the timing loop to new values if the output of the steady state error removal unit is less than the predetermined threshold value. The gain adjuster also adjusts the gain factors to new values an interval of time after the threshold value has been passed in accordance with values stored in a memory.

The above described apparatus allows a timing loop to synchronize a receiver's clock to the timing of a received data signal more quickly when the initial frequency error is less than the maximum frequency error expected. The apparatus accomplishes this useful result by adaptively adjusting the timing loop parameters, which represent gain stages in the timing loop, based upon the absolute value of the difference between the current frequency error and the average frequency error. Adaptively adjusting the timing loop parameters based upon the frequency error allows the apparatus to utilize the timing loop parameter values and time intervals that are best suited for the particular frequency error involved. Thus, an apparatus constructed in accordance with the present invention is a substantial improvement over the prior art.

DETAILED DESCRIPTION OF THE INVENTION

As briefly discussed above, a frequency error may occur between a transmitter's clock at a central office and a receiver's clock at a remote location. This frequency error may result from a variety of factors. For example, manufacturing tolerances result in small differences in the frequency produced by the oscillator in the receiver. Because the frequency of the transmitter's clock and the frequency of the receiver's clock are slightly different, the receiver at the remote location must train or synchronize its clock to the transmitter's clock.

As an example of the above discussed frequency error, consider the case where a data signal is being transmitted from a central office of a telecommunications network to a remote customer premise over communication wires. The transmitter at the central office and the receiver at the remote customer premise employ different clocks having slightly different clock frequencies. Because there are different clock frequencies, there is a frequency error between the transmitted data signal and the clock in the receiver that is used to sample the transmitted data at the remote customer premises. Synchronizing the receiver's clock to the data signal that it is receiving is difficult because signal distortion may have been introduced into the received signal by the communication wires.

Figure 1:
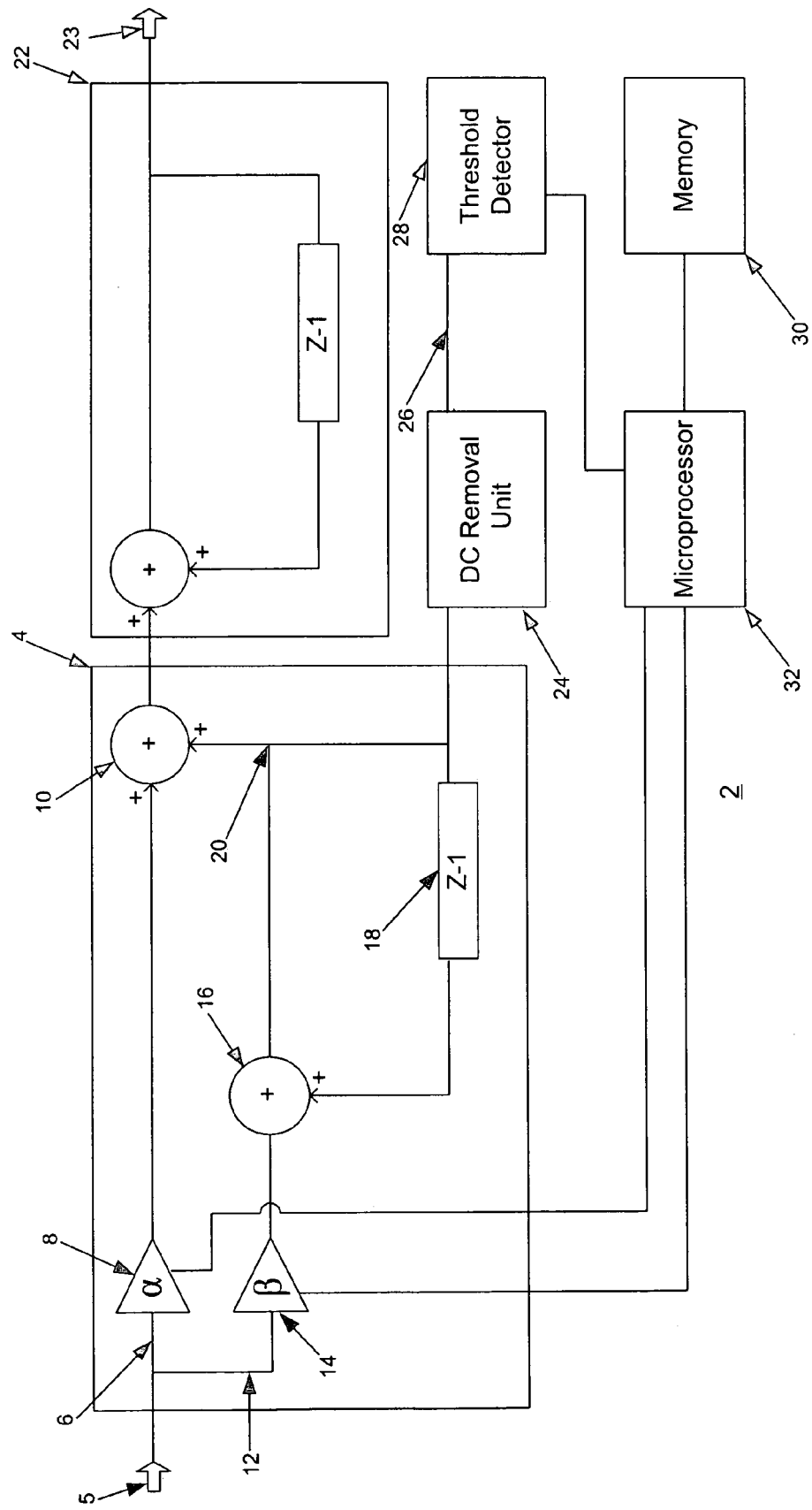
FIG. 1 is a diagrammatical representation of a preferred timing loop in accordance with the present invention.

Referring now to FIG. 1, a diagrammatical representation of a timing loop 2 in a receiver in accordance with the present invention is shown. The timing loop 2 includes a loop filter 4 that receives a phase error 5 from a phase detector (not shown). This phase error 5 represents a timing difference between a transmitter's clock used to transmit a data signal and a receiver's clock signal used to sample the transmitted data signal. The phase error 5 is provided to a first scaled path 6 that passes through a first gain or scaling stage 8, having an initial gain of α, to a first input of a first summing unit 10 and a second scaled path 12 that passes through a second gain stage 14, having an initial gain of β, to a second summing unit 16. The output 20 of the second summing unit 16 is fed back to the second summing unit 16 through a delay stage 18. Thus, the output 20 of the second summing unit 16 represents an accumulated version of the output of the second gain stage 14.

The output 20 of the second summing unit 16 is referred to as the frequency error because it is representative of the frequency error between the transmitter's clock signal used to transmit the data signal and the receiver's clock signal used to sample the data signal. This frequency error 20 is used to correct for timing differences between the received data signal and the receiver's clock as discussed in more detail below. The frequency error 20 is also coupled to a second input of the first summing unit 10. The output of the first summing unit 10 is coupled to an accumulator 22 that accumulates the output of the first summing unit 10 to produce a clock control output 23. The clock control output 23 of the accumulator 22 is used to modify the frequency of a voltage controlled oscillator that is used to generate the receiver's sample clock. The clock control output 23 modifies the receiver's clock frequency such that synchronization between the receiver's clock and the transmitter's clock is acquired or maintained.

The frequency error output 20 is also coupled to a DC removal unit 24 that determines the difference between the average, or DC, frequency error and the current frequency error 20. A functional diagram of an exemplary system for calculating this difference is shown in more detail in FIG. 7. As discussed above, the frequency error 20 is representative of a frequency difference between the transmit clock used to transmit the data signal and the clock in the receiver used to sample the data signal. The DC frequency error is essentially an average value of the frequency error 20 calculated over a given period of time. Thus, the DC removal unit's output 26 corresponds to the absolute value of the difference between the average frequency error produced at output 20 over a period of time and the current, or most recently determined, frequency error at output 20.

The output 26 of the DC removal unit 24 is provided to a threshold detector 28. The threshold detector 28 determines if the value of the DC removal unit's output 26, which corresponds to the absolute value of the current frequency error minus the average frequency error, is less than a predetermined threshold value. The predetermined threshold value may be contained in a memory 30 or hardwired, such as with a programmable gate array, into the threshold detector 28. If the output 26 is less than the predetermined threshold value, a microprocessor 32 adjust the gains, $\alpha$ and $\beta$, of the first gain stage 8 and the second gain stage 14 to a second set of predetermined values, $\alpha_1$ and $\beta_1$, contained in the memory 30. The gains $\alpha$ and $\beta$ are often referred to as the timing loop parameters of the timing loop 2. If the absolute value of the frequency error minus the average frequency error is not less than the predetermined threshold value, the microprocessor 32 does not adjust the timing loop parameter values. While elements such as the microprocessor 32, DC removal unit 24 and threshold detector 28 are functionally depicted as different elements in FIG. 1, it will be readily appreciated by one skilled in the art that an actual physical embodiment of the invention as shown in FIG. 1 might be implemented on a single semiconductor chip such as a custom gate array.

The timing loop parameters $\alpha$ and $\beta$ control the rate at which the frequency of the receiver's clock approaches the frequency of the received data signal. When a data transmission first begins, there will be some frequency error between the transmit clock being used to transmit the data signal and the receive clock used to sample the data signal. While the initial magnitude of this frequency error is unknown, the frequency error should decrease over time as the receiver trains timing loop 2 to the transmitted clock frequency. Large values of the parameters allow the timing loop 2 to quickly adjust the receiver's clock frequency by producing a clock control output 23 that adjusts the sample clock frequency in relatively large increments. Thus, relatively large timing loop parameters 8 and 14 cause the sample clock frequency to be altered relatively quickly. As time passes, the receiver will have trained its clock to the transmitter's clock such that a smaller frequency error will exist between the transmitter's clock frequency and the receiver's clock frequency. Smaller values of the timing loop parameters 8 and 14 keep the timing loop 2 at, or near, a desired frequency while minimizing jitter by producing a clock control output 23 that adjusts the frequency of the sample clock in smaller increments. Altering the sample clock frequency in smaller increments minimizes jitter by decreasing the likelihood that the adjustments made to the sample clock frequency will overcompensate for differences between the receiver's clock frequency and the transmitter's clock frequency. This overcompensation may result in the timing loop alternately adjusting the receiver's clock to a higher and lower frequency as the timing loop attempts to synchronize the receiver's clock to the transmitter's clock frequency.

One manner in which to alter the parameters 8 and 14 to receive the benefits of both large and small parameter values is to simply set the parameters 8 and 14 to an initial value and then reset them to new values after an initial period of time has passed. This period of time allows the receiver's clock to rapidly approach the transmitter's clock frequency before the timing loop parameters 8 and 14 are adjusted to lower parameter values. However, it has been determined by the present inventors that adjusting the timing loop parameters 8 and 14 based upon the absolute value of the current frequency error 20 minus the average value of the frequency error decreases the settling time of the timing loop. Thus, in accordance with the preferred approach, the timing loop parameters 8 and 14 are set to initial values. Once the absolute value of the frequency error minus the average frequency error falls below a predetermined threshold, the timing parameters 8 and 14 are reset to new parameter values. Preferably, the new timing loop parameter values are less than the initial parameter values. Thus, adjusting the timing loop parameters 8 and 14 based upon the frequency error as described above results in the timing loop acquiring timing faster when the initial frequency error is less than the maximum frequency error expected.

Once the absolute value of the frequency error minus the average frequency error has fallen below the initially set threshold value and the gain parameters 8 and 14 have been reset, the threshold value may be reset and the process repeated until the absolute value of the frequency error minus the average frequency error falls below a final threshold value. Once this final threshold value has been passed, the timing loop parameters 8 and 14 are set to predetermined steady state values. Alternatively, once the frequency error has fallen below the initial threshold value, the timing loop parameters may be reset to new parameter values stored in a memory 30 in accordance with a predetermined schedule. Thus, after the initial threshold has been broken, the parameters are reset to a series of new parameter values after a series of predetermined intervals. Furthermore, the timing loop 2 is preferably configured such that the threshold value is reset to its initial value whenever it is determined that timing needs to be reacquired. However, it will be readily appreciated by those skilled in the art that the actual values to which the timing loop parameters 8 and 14 will be reset and the particular threshold values to be used will depend upon a wide variety of factors. Thus, these values are preferably determined empirically for the particular product in which they are to be implemented. The procedure for determining these values empirically would be to set the timing loop parameters to a series of initial values and then determine which values resulted in the timing loop acquiring timing the fastest for a broad range of frequency errors.

With the above discussion in mind, a sample set of α and β pairs that were determined to be most beneficial in the products upon which the inventors of the current application experimented are set forth below in Table 1.

TABLE 1

| α | β |
|---|---|
| $2^4$ | $2^{-10}$ |
| $2^2$ | $2^{-12}$ |
| $2^0$ | $2^{-15}$ |
| $2^{-1}$ | $2^{-16}$ |

Thus, in accordance with the embodiment set forth in Table 1, the timing loop parameters 8 and 14 are initially set to values of $2^4$ and $2^{-10}$. Once the initial threshold value has been passed, the timing loop parameters 8 and 14 are respectively reset to values of $2^2$ and $2^{-12}$. Then, after a predetermined interval of time has passed, the timing loop parameters 8 and 14 are reset to values of $2^0$ and $2^{-15}$. Finally, after the expiration of a second predetermined interval of time, the timing loop parameters are respectively set to their final values $2^{-1}$ and $2^{-16}$. If the data transmission is terminated or synchronization is lost, the timing loop parameters are reset to their initial values of $2^4$ and $2^{-10}$.

The threshold value upon which the determination to alter the parameters α and β depends is also preferably determined experimentally by varying the threshold value for a given set of timing loop parameters and observing the time required for the timing loop to acquire timing. Thus, by varying the threshold values and measuring the time required for the timing loop to acquire timing, the approximate threshold values that will cause the timing loop of the particular application to acquire timing the fastest can be determined. Thus, the present invention is expressly not limited to any particular threshold value. However, an initial threshold value of 0.01 is preferred for use in conjunction with the gain parameters of Table 1.

Varying the above discussed timing loop parameters and threshold values based upon frequency errors between a local sample clock frequency and a received signal's frequency allows a receiver operating in accordance with the present invention to train its timing loop to the timing of the modulated received signal more quickly than a traditional receiver when the initial frequency error is less than the maximum frequency error expected.

Figure 2:
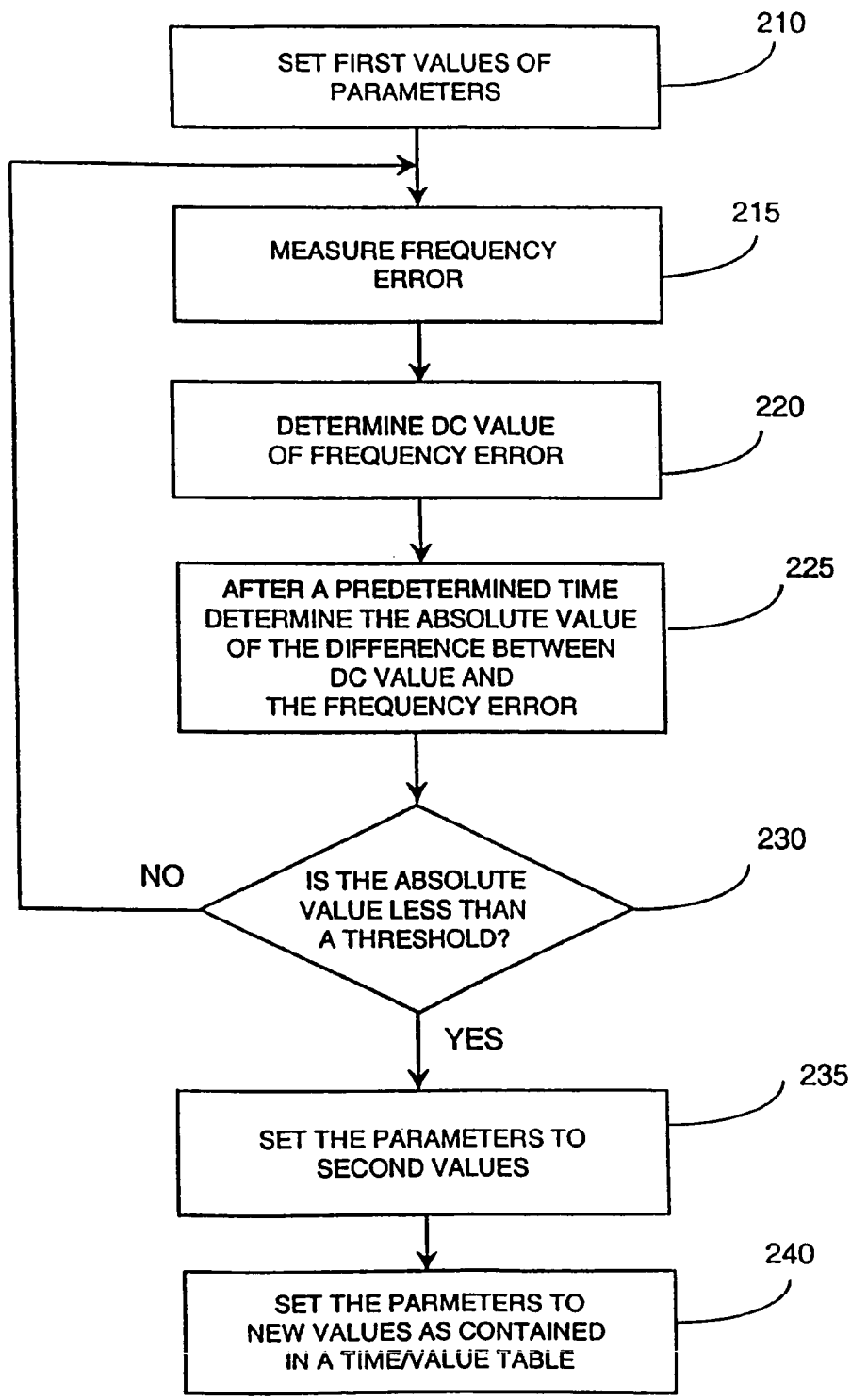
FIG. 2 is a flow chart of a preferred method in accordance with the present invention.

Referring now to FIG. 2, a flow chart of a preferred method 200 in accordance with the present invention is shown. The method commences in block 210 with the setting of the timing loop parameters to an initial set of parameter values. The next step is to determine a frequency error between a signal being received and a local clock as shown in block 215. The frequency error represents a timing difference between the received signal's frequency and the local clock signal's frequency. An approximate average or DC value of the frequency error is determined in block 220. After a predetermined interval of time, the absolute value of the difference between the DC frequency error value and the frequency error is then determined as shown in block 225.

The absolute value of the difference between the frequency error and the average frequency error is examined in decisional block 230 to determine if the magnitude of this difference has fallen below a threshold value. It is necessary to wait a predetermined interval of time before examining the difference between the frequency error and the average frequency error because the average frequency error will initially be very close in value to the current frequency error. If the difference between the frequency error and the DC frequency error has not fallen below the threshold value, the preferred method loops back to blocks 215 and 220 wherein a current frequency error is determined and the average frequency error is recalculated. If the difference between the frequency error and the DC frequency error is less than the threshold value, the method proceeds to block 235 and the timing loop parameters are reset to a second set of values. The timing loop parameters are thereafter set to new values after regular intervals of time as shown in block 240.

Adaptively adjusting the timing loop parameters based upon the difference between a current frequency error and an average frequency error in the manner discussed above allows the timing loop to acquire timing faster. This is particularly true when the initial frequency difference between the received signal's frequency and the sample clock's frequency is relatively small. In such a situation, the above discussed method quickly replaces the large initial timing loop parameter values with relatively smaller values that are better suited to correcting for small frequency differences. The smaller values of the timing loop parameters keep the loop relatively close to its steady state operating frequency and minimize the introduction of additional jitter. As discussed above, the particular parameter values to be used and the particular thresholds at which to implement them are empirically determined in accordance with the desired performance characteristics of the timing loop.

Figure 3:
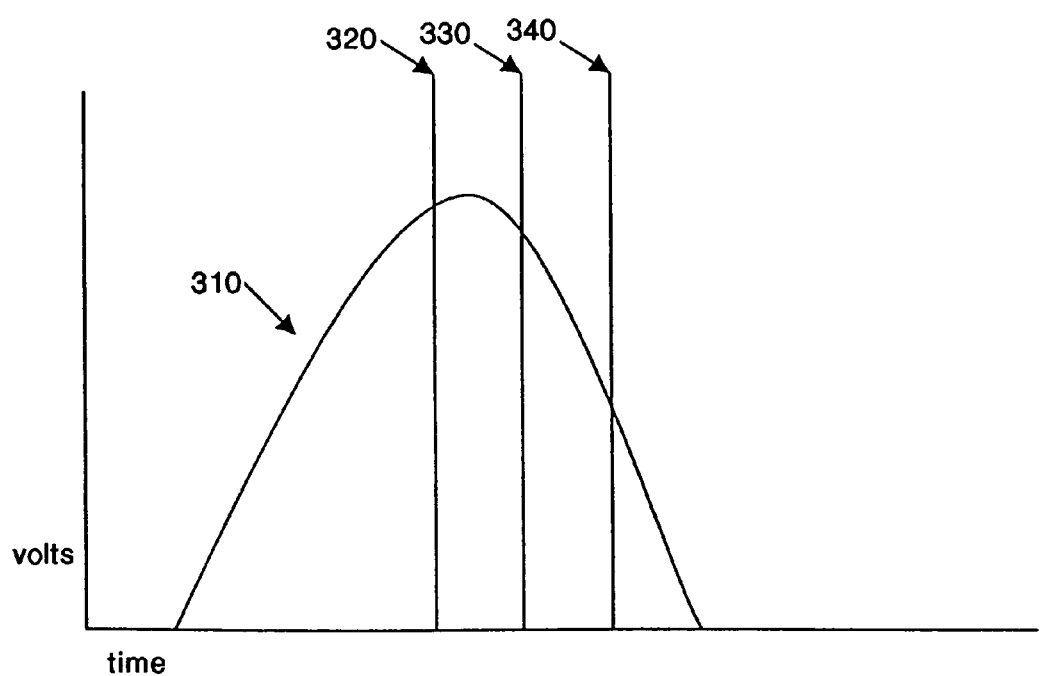
FIG. 3 is a graphical representation of a waveform and sampling times in accordance with the present invention.

The input to the preferred timing loop of the present invention is a phase error that represents a phase difference between a transmit clock being used to transmit a data signal and a receive clock being used to sample the data signal. While the present invention is not limited to any particular manner of calculating this phase error, a preferred method is graphically illustrated in FIG. 3. FIG. 3 depicts a voltage waveform 310 received from a transmitter as a function of time. The waveform 310 is received by a sampler that samples the waveform at three different sampling times. The three preferred sampling times are (1) a center sample 330 taken at the sample time indicated by the clock of the receiver, (2) an early sample 320 taken a predetermined amount of time before the center sample, and (3) a late sample 340 taken a predetermined amount of time after the center sample 330 wherein the early sample 320 and the late sample 340 are equally distant in time from the center sample 330.

Once the early 320 and late 340 samples have been taken, the phase error can be determined by subtracting the late sample value 340 from the early sample value 320. Typically, this value will be a voltage value. However, if the transmit waveform 310 is approximately symmetrical, this voltage value is proportional to the phase error between the receiver's clock and the transmitter's clock. Thus, the difference between the voltage values of the early 320 and late 340 samples functions as a phase error. For example, if the center sample 330 is at the correct time for sampling and the waveform is symmetrical, the early sample value 320 minus the late sample value 340 will be approximately equal to zero. Conversely, if the center sample 330 is taken too early, the early sample value 320 will be less than the late sample value 340. Finally, if the center sample 330 is taken too late, the late sample value 340 will be less than the early sample value 320. It is this situation that is shown in FIG. 3. Thus, the phase error for the waveform shown in FIG. 3 is equal to the waveform value at time 320 minus the waveform value at time 340. While the sampling scheme of FIG. 3 illustrates a preferred method of determining the phase error, it will be readily appreciated by those skilled in the art that a variety of different methods could be used in conjunction with the present invention.

Figure 4:
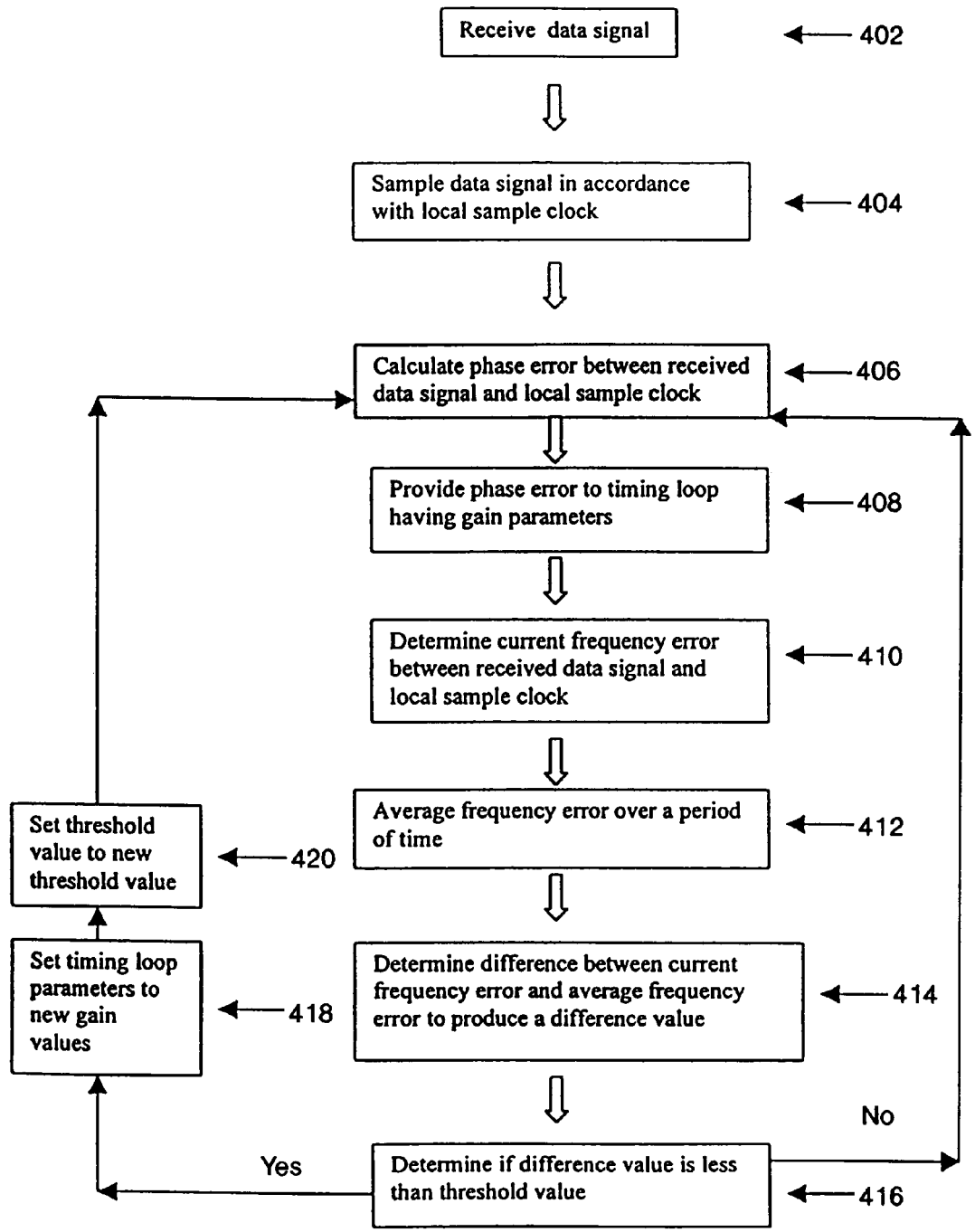
FIG. 4 is a most preferred embodiment of a method of adaptively adjusting a timing loop in a receiver in accordance with the present invention.

Another method of adaptively adjusting the gain parameters of a timing loop in a receiver in accordance with the present invention is shown in FIG. 4. The method commences with the receiving of a data signal transmitted in accordance with a transmitter's clock as shown in block 402. The received signal is sampled in accordance with a local sample clock in a receiver in step 404. In step 406, a phase error between the received data signal and the local sample clock signal is calculated. This phase error is preferably calculated as discussed above with respect to FIG. 3. The phase error is then provided to a timing loop having a set of timing loop gain parameters set to initial gain values in step 408. The timing loop produces a frequency error term in step 410 that represents the current difference between the frequency of the received data signal and the frequency of the local sample clock. This frequency error is averaged over a period of time in step 412 to produce an average frequency error. Next, as shown in step 414, the absolute value of the difference between the average frequency error and the current frequency error is calculated to produce a difference value. In decisional step 416, the difference value is compared to an initial threshold value to determine whether or not the difference value is less than the threshold value. If the difference value is less than the threshold value, the timing loop parameters are set to new gain values as shown in step 418. A new threshold value is also set, in step 420, and the method returns to block 406 whereby, after an interval of time, the difference between the new current frequency error and the updated average frequency error is determined and compared to the new threshold value. The method continues modifying the timing loop parameters until the difference value is less than a final threshold value and the timing loop parameters have been set to steady state operating parameter values. By continuously updating the timing loop parameter values based upon the deviation of the frequency error from the average frequency error, the above discussed method allows the timing loop parameters to be reduced at the optimum times for the current frequency error present.

Figure 5:
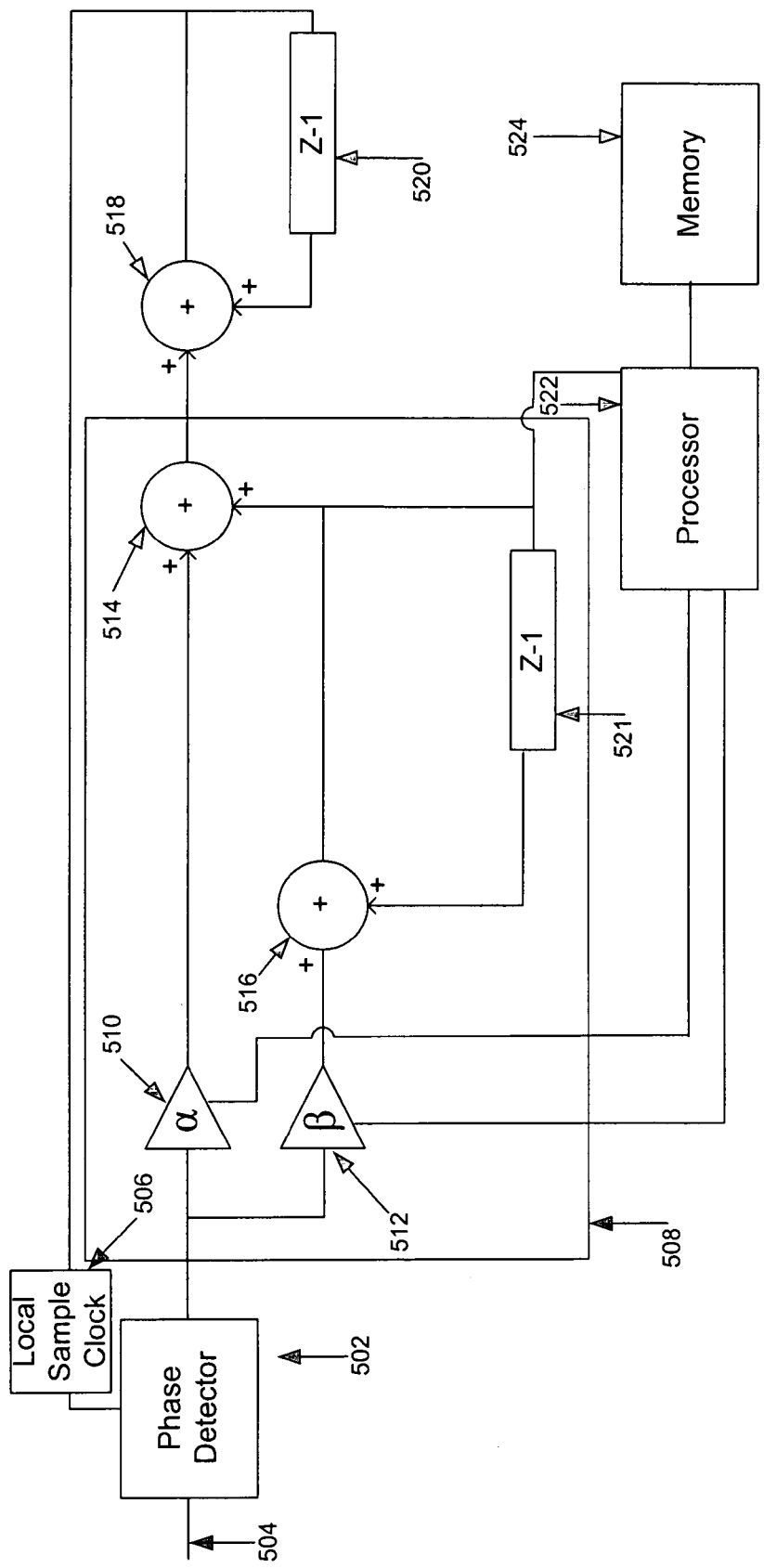
FIG. 5 is a diagrammatical representation of a circuit that could be utilized to implement to the present invention.

A diagrammatical representation of a circuit that could be utilized to implement the present invention is set forth in FIG. 5. The circuit includes a phase detector 502 that produces an output that is proportional to a phase difference between a data signal received on input 504 and a local sample clock signal from a local sample clock 506. The data signal from the data input 504 is sampled by a sampler in accordance with the sample clock signal from the local sample clock 506. The phase detector's 502 output is provided to a timing loop 508 that locks the timing of the local sample clock 506 to the timing of the data signal. The timing loop 508 has a path through a first gain stage 510 and a path through a second gain stage 512. The output of the first gain stage 510 is provided to a summing unit 514. The output of the second gain stage 512 is provided to a summing unit 516 whose output is fed back to the summing unit through a delay stage 521 such that it is accumulated. The accumulated output corresponds to a frequency error between the timing of the received data signal and the local sample clock signal. This frequency error is provided to summing unit 514 where it is summed with the output of the first gain stage 510. The output of summing unit 514 is accumulated by the summing unit 518 and its associated delay stage 520. The accumulated output of the summing unit 518 is then used as a frequency modification term to alter the frequency of the local sample clock 506.

A processor 522 receives the frequency error from the summing unit 516. As previously discussed, the frequency error is proportional to a frequency difference between the data signal and the local sample clock 506 signal. The processor 522 calculates an approximate average frequency error based upon the frequency error values from the summing unit 516 over a predetermined period of time. The processor 522 further calculates the absolute value of the difference between the frequency error and the average frequency error. If this difference value is less than a reference threshold value contained in a memory 524, the processor 522 operates to alter the gains of the first 510 and second 512 gain stages to a new set of gain values contained in the memory 524. Thus, the apparatus of FIG. 5 provides the above discussed advantages of a timing loop that adaptively adjusts the timing loop parameters based upon a frequency error between a received signal and a local clock signal.

Figure 6:
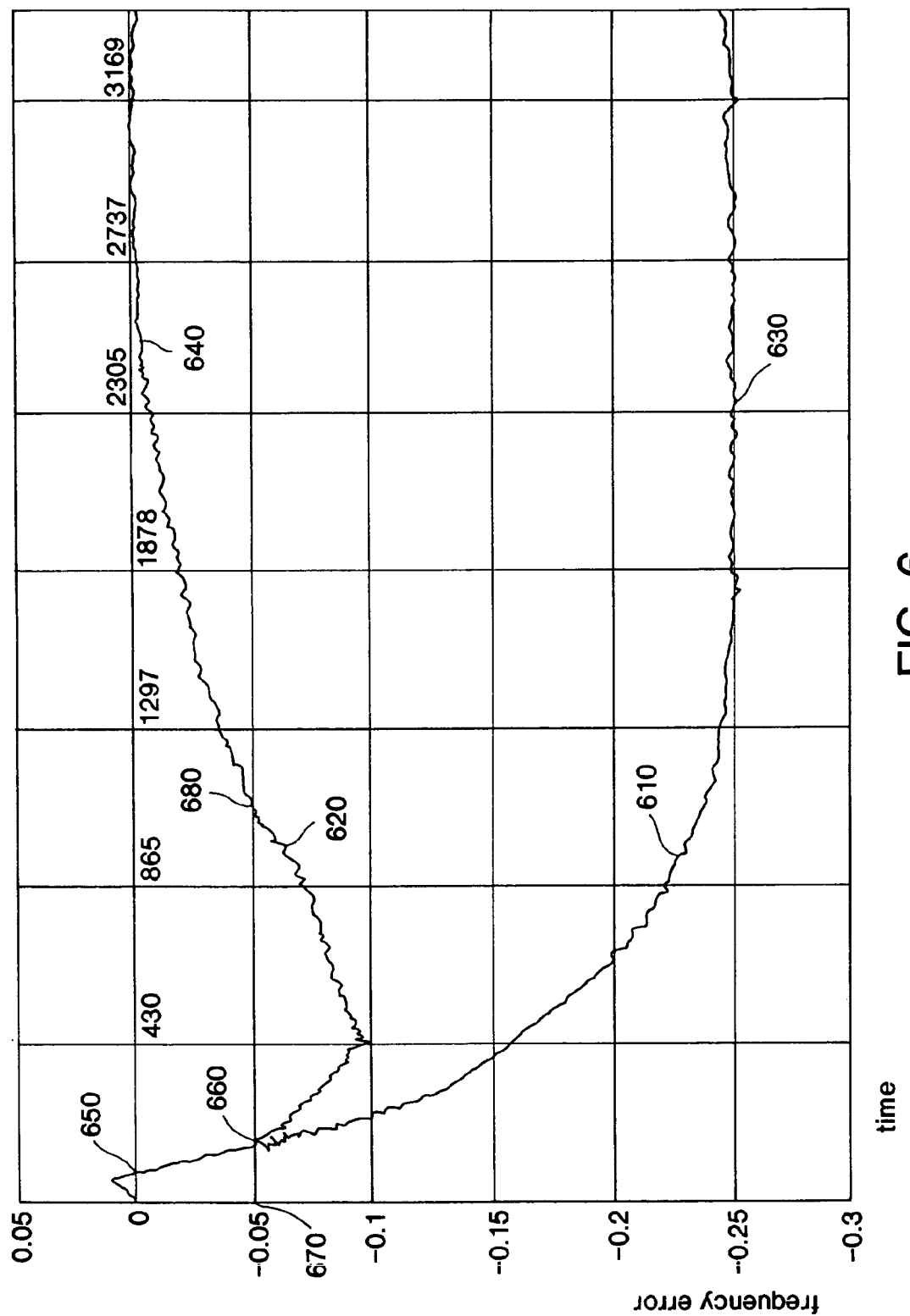
FIG. 6 is a graph of frequency error, and frequency error minus average frequency error, versus time for an exemplary timing loop.

Referring now to FIG. 6, a graph of frequency error 610 versus time for an exemplary timing loop is shown. The graph also shows the corresponding current frequency error minus the average value of the frequency error 620 versus time for the exemplary timing loop. As can be seen from examining the graph, the frequency error 610 between a transmitter's clock and a receiver's clock tends to approach a steady state value 630 as time passes. As the frequency error 610 stabilizes, the frequency error and the average frequency error become close to the same value. Thus, the graph of the frequency error minus the average frequency error 620 approaches zero 640. By adaptively modifying the timing loop parameters based upon the frequency error minus the average frequency error 620, a timing loop is created that can train its timing as quickly as possible over a broad range of frequency errors. More particularly, by adjusting the timing loop parameters based upon the frequency error, it is possible to train a timing loop more quickly for smaller frequency error values with out the introduction of excessive jitter into the signal. Thus, modifying the loop parameters based upon frequency errors is a substantial improvement over the prior art.

FIG. 6 also illustrates why it is necessary to wait a predetermined amount of time before comparing the current frequency error minus the average frequency error 620 to a threshold value. When the data transmission first begins, the current frequency error is the only frequency error included in the average frequency error. Thus, the frequency error will be approximately equal to the average frequency error during an initial startup period. This situation is represented in FIG. 6 at time 650. After this initial time period, the absolute value of the difference between the frequency error and the average frequency error remains above a threshold value 670 from time 660 to time 680. However, when the absolute value of the difference between the frequency error and the average frequency error falls below the threshold value 670 at time 680, the timing loop is beginning to closely synchronize the sample clock to the received data signal. It is at time 680 that the maximum benefits are achieved by adjusting the timing loop parameters to lower values that will alter the sample clock frequency at a slower rate. Thus, a preferred system in accordance with the present invention will wait until time 660 to begin examining the difference between the frequency error and the DC frequency error.

Figure 7:
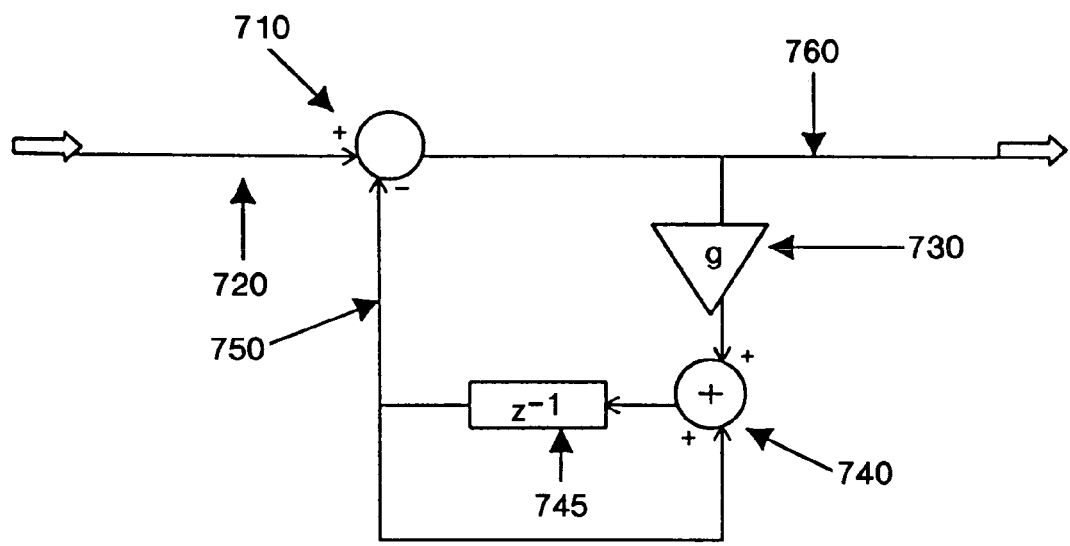
FIG. 7 is a diagrammatical representation of a preferred circuit for determining the difference between an average frequency error and a current frequency error.

A functional diagram of a preferred circuit for calculating the difference between a current frequency error and a steady state or average frequency error is shown in FIG. 7. The circuit consists of a summing unit 710 that receives the current frequency error 720. The output 760 of the summing unit 710 is passed through a gain stage 730 that scales the frequency error by a gain factor represented by g. The scaled frequency error is combined with the accumulated value of the scaled frequency error by the summing unit 740 and its associated delay stage 745 to produce an approximate average frequency error value 750. This average frequency error 750 is then subtracted from the current frequency error 720 by the summing unit 710 to produce a difference value 760. This difference value 760 is then compared to a threshold value to determine when to modify the timing loop parameters as described above.

While we have shown and described several preferred embodiments in accordance with the present invention, it is expressly understood that the present invention is not limited to the particular embodiments described herein, but is susceptible to numerous modifications as recognized by one skilled in the art. Therefore, the true scope of the present inventors' invention is as set forth in the following claims.

We claim:

1. A method for adapting a timing loop having timing loop parameters to an environment having a broad range of frequency errors, the method comprising the steps of:
   setting the timing loop parameters of the timing loop to initial values;
   waiting a predetermined interval of time;
   measuring a frequency error between a receiver's clock signal and a received data signal;
   determining an average value of the frequency error;
   subtracting the average value of the frequency error from the frequency error to produce a difference value; and
   resetting the timing loop parameters to new timing loop parameter values if the difference value is less than a threshold value.

2. The method of claim 1 wherein the step of resetting the timing loop parameters to new parameter values further comprises retrieving stored timing loop parameter values from a memory.

3. The method of claim 1 further comprising the steps of replacing the threshold value with a second threshold value if the difference value is less than the threshold value and resetting the timing loop parameters to new parameter values if the difference value calculated after an interval of time is less than the second threshold value.

4. The method of claim 1 wherein the new parameter values of the timing loop parameters are less than the initial values of the timing loop parameters.

5. The method of claim 1 further comprising the steps of:
   waiting a second predetermined interval of time after the difference value falls below the threshold value; and
   resetting the new timing loop parameter values to a second set of new timing loop parameter values after the second predetermined interval of time has passed.

6. The method of claim 1 wherein said step of measuring a frequency error further comprises sampling a received data signal at a center sample time, an early sample time and a late sample time and calculating said frequency error based on a difference between sample values at the early sample time and the late sample time.

7. An apparatus for synchronizing a local sample clock in a receiver to a received data signal transmitted in accordance with a transmitter's clock, the apparatus comprising:

a phase error detector for producing a phase error signal wherein said phase error signal corresponds to a phase difference between said local sample clock and said received data signal;
   a timing loop having timing loop parameters for receiving the phase error signal and producing a frequency error that corresponds to a frequency error between said local sample clock and said data signal; and
   a processor for;
      determining an average value of said frequency error between said local sample clock and said data signal;
      calculating the absolute value of the difference between the frequency error and the average value of the frequency error; and
      controllably adjusting the timing loop parameters to new parameter values if the absolute value of the difference between the frequency error and the average frequency error is less than a threshold value.

8. The apparatus of claim 7 wherein the processor further adjusts the timing loop parameters to a second set of new parameter values a predetermined interval of time after the difference between the frequency error and the average frequency error is less than the threshold value.

9. The apparatus of claim 7 further comprising a memory for storing the new timing loop parameter values.

10. The apparatus of claim 7 wherein the timing loop further comprises:
    a first scaled path having a first gain stage wherein the first gain stage produces an output equal to the phase error signal scaled by a gain factor of $\alpha$;
    a second scaled path having a second gain stage wherein the second gain stage produces an output equal to the phase error signal scaled by a gain factor of $\beta$;
    an accumulator coupled to the output of the second scaled path wherein the accumulator produces an output equal to an accumulated value of the output of the second gain stage; and
    a summing stage for summing the output of the accumulator and the first gain stage.

11. The apparatus of claim 10 further comprising a phase accumulator for accumulating the output of the summing stage to produce a clock control output that is used to control the local sample clock in the receiver.

12. An apparatus for adaptively adjusting parameters of a timing loop to establish timing between a transmitter's clock and a receiver's clock, the apparatus comprising:
    a phase error detector for detecting a phase difference between the transmitter's clock and the receiver's clock and producing an output that corresponds to the phase difference;
    a first gain stage that produces an output equal to the output of the phase error detector scaled by a gain factor of $\alpha$;
    a second gain stage that produces an output equal to the output of the phase error detector scaled by a gain factor of $\beta$;
    an accumulator for accumulating the output of the second gain stage and producing a frequency error;
    a removal unit for receiving the frequency error from the accumulator and producing an output equal to the absolute value of the difference between the frequency error and an approximate average frequency error;
    a threshold detector for receiving the output of the removal unit and determining if the output is less than a predetermined threshold amount; and a gain adjuster for adjusting the gain factors α and β of the first and second gain stages to new values if the output of the removal unit is less than the predetermined threshold value.

13. The apparatus of claim 12 further comprising a memory wherein the memory stores a set of values for the gain factors α and β.

14. The apparatus of claim 13 wherein the gain adjuster further adjusts the gain factors α and β to a second set of new values a predetermined interval of time after the removal unit's output falls below the threshold value.

15. The apparatus of claim 12 wherein the removal unit further comprises a scaled path that receives the frequency error and scales the frequency error by a scaling factor, an accumulator that accumulates the scaled frequency error over a period of time, and a subtractor for removing the accumulated scaled frequency errors from the frequency error.

16. An method of adaptively adjusting timing loop parameters of a timing loop that is being utilized to synchronize a receiver's clock to a received data signal, the method comprising the steps of:
 detecting a phase difference between the received data signal and the receiver's clock;
 accumulating the phase difference to produce a current frequency error;
 averaging the current frequency error over an interval of time to produce an average frequency error;
 determining if the absolute value of the difference between the current frequency error and the average frequency error output is less than a predetermined threshold amount; and
 adjusting the timing loop parameters to new parameter values if the absolute value of the difference between the current frequency error and the average frequency error is less than the predetermined threshold value.

17. The method of claim 16 wherein the step of accumulating the phase difference to produce a current frequency error further comprises scaling the phase difference by a timing loop parameter, β, and accumulating the scaled phase difference to produce a frequency error.

18. The method of claim 17 further comprising the steps of scaling the phase difference by a timing loop parameter, α, summing the scaled phase difference with the frequency error to produce a summed output, accumulating the summed output to produce a clock control signal and using the clock control signal to modify a clock period of the receiver's clock.

19. The method of claim 18 further comprising adjusting the timing loop parameters α and β to a second set of new parameter values a predetermined interval of time after the difference between the current frequency error and the average frequency error became less than the threshold value.

20. The method of claim 19 wherein the steps of averaging the current frequency error and determining a difference between the current frequency error and the average frequency error further comprise scaling the frequency error by a gain factor, accumulating the scaled frequency errors and subtracting the accumulated scaled frequency errors from the current frequency error.

21. A method for adaptively adjusting parameters of a timing loop, the method comprising the step of:
 measuring a current frequency error of a clock signal of a receiver, thereby providing a first value indicative of the current frequency error;
 determining a second value indicative of an average of frequency error of the clock signal over time;
 combining the first and second values, thereby providing a combined value;
 comparing the combined value to a threshold; and
 adaptively adjusting, based on the comparing step, parameters of a timing loop of the receiver.

22. The method of claim 21, wherein the combined vaulue is indicated of a difference between the average and the current frequency error.

* * * * *